United States Patent
Kurz et al.

(10) Patent No.: US 10,322,921 B2
(45) Date of Patent: Jun. 18, 2019

(54) ONE-PIECE BOARD LEVEL SHIELDING WITH PEEL-AWAY FEATURE

(71) Applicant: A.K. STAMPING COMPANY, INC., Mountainside, NJ (US)

(72) Inventors: Arthur Kurz, New Vernon, NJ (US); Mark Andrews, Wharton, NJ (US); Michael Schneider, Montgomery, NY (US)

(73) Assignee: A.K. Stamping Company, Inc., Mountainside, NJ (US)

( * ) Notice: Subject to any disclaimer, the term of this patent is extended or adjusted under 35 U.S.C. 154(b) by 0 days.

(21) Appl. No.: 13/777,669

(22) Filed: Feb. 26, 2013

(65) Prior Publication Data

US 2013/0199011 A1 Aug. 8, 2013

Related U.S. Application Data

(62) Division of application No. 12/836,263, filed on Jul. 14, 2010, now Pat. No. 8,383,960.

(51) Int. Cl.
*H05K 9/00* (2006.01)
*B66F 15/00* (2006.01)

(52) U.S. Cl.
CPC .......... *B66F 15/00* (2013.01); *H05K 9/0026* (2013.01); *H05K 9/0032* (2013.01); *Y10T 29/4973* (2015.01); *Y10T 29/49721* (2015.01); *Y10T 428/15* (2015.01)

(58) Field of Classification Search
CPC ................................ B25C 11/00; H05K 9/00
USPC .......... 254/30, 120, 131.5, 134, 131, 133 R, 254/18–28; 361/755; 174/377, 382
See application file for complete search history.

(56) References Cited

U.S. PATENT DOCUMENTS

| | | | |
|---|---|---|---|
| 466,628 A | * | 1/1892 | Shea ....................... B25D 1/00 7/146 |
| 5,614,694 A | | 3/1997 | Gorenz, Jr. et al. |
| 6,178,097 B1 | | 1/2001 | Hauk, Jr. |
| 6,384,324 B2 | | 5/2002 | Flegeo |
| 6,501,016 B1 | | 12/2002 | Sosnowski |

(Continued)

OTHER PUBLICATIONS

Notice of Allowance dated Oct. 22, 2012 from U.S. Appl. No. 12/836,263 (8 pages).

(Continued)

*Primary Examiner* — David P Bryant
*Assistant Examiner* — Nirvana Deonauth
(74) *Attorney, Agent, or Firm* — McCarter & English, LLP

(57) ABSTRACT

A one-piece board level shielding element with a top cover peel panel is secured to a circuit board to shield and provide access to a shielded component. The shielding element is formed with a top having a peel line to facilitate removal of the peel panel with a peel tool. Once the repair is completed, a new cover is put on to the remaining side-walls to reestablish the shielding. The shield top cover is formed with a peel tool insertion slot and an adjacent peel start slot. The peel panel is removed by a peel tool having a peel hook mounted to a cylindrical peel key that is inserted into the insertion slot and hooks the cover at the peel start slot. Upon rotating the peel key away from the peel start slot, the peel panel is easily removed. A fixture plate may be used to support the peel tool and assist in removal of the peel panel.

18 Claims, 6 Drawing Sheets

(56) References Cited

U.S. PATENT DOCUMENTS

| | | |
|---|---|---|
| 6,831,224 B2 | 12/2004 | Koivusilta |
| 6,870,091 B2 | 3/2005 | Seidler |
| 6,897,371 B1 | 5/2005 | Kurz et al. |
| 6,903,262 B2 | 6/2005 | Blersch |
| 7,113,410 B2 | 9/2006 | Pawlenko et al. |
| 7,119,286 B1 | 10/2006 | Horng |
| 7,208,675 B2 | 4/2007 | Horng |
| 7,347,467 B2 * | 3/2008 | Theobald ............ 294/24 |
| 7,544,885 B2 | 6/2009 | Horng |
| 7,724,542 B2 | 5/2010 | Gallahan et al. |
| 7,961,479 B2 | 6/2011 | Wang |
| 8,383,960 B2 | 2/2013 | Kurz et al. |
| 2002/0139552 A1 | 10/2002 | Chang |
| 2005/0121212 A1 | 6/2005 | English et al. |
| 2008/0158849 A1 | 7/2008 | Gallahan et al. |
| 2010/0283017 A1 * | 11/2010 | Darbinyan ............ 254/129 |
| 2011/0266045 A1 | 11/2011 | Xiong et al. |
| 2012/0015127 A1 | 1/2012 | Kurz et al. |

OTHER PUBLICATIONS

Office Action dated Aug. 1, 2012 from U.S. Appl. No. 12/836,263 (7 pages).
Office Action dated Apr. 26, 2012 from U.S. Appl. No. 12/836,263 (6 pages).

* cited by examiner

ONE-PIECE BOARD LEVEL SHIELDING WITH PEEL-AWAY FEATURE

RELATED APPLICATIONS

This application is a divisional application of, and claims priority to, U.S. patent application Ser. No. 12/836,263 filed on Jul. 14, 2010, the entire disclosure of which is expressly incorporated herein by reference.

BACKGROUND OF THE INVENTION

Field of the Invention

The invention relates generally to shielding elements, and more particularly to an improved one-piece board level shielding element for electrical or electronic components of an electric or electronic circuit with a cover that can be removed for repair of the component by peeling away the top cover of the shield.

Related Art

Shielding elements are used in electric and/or electronic circuits to screen specific components of the circuit against electromagnetic radiation, in particular against spurious emission or irradiation. In particular, screening or shielding elements are used to comply with the requirements of EMC (electro magnetic compatibility) standards.

Usually such shielding elements have an annular side wall that can be mounted on a printed circuit board in a usual way, e.g. by soldering, and that surrounds the components to be shielded. After mounting the annular side wall and the components to be shielded onto the printed circuit board, a cover is used to close a ceiling opening that is defined by the upper edge of the annular side wall. A bottom opening that is defined by the lower edge of the side wall is closed by the substrate or printed circuit board. The terms "upper" and "lower" are used in this description to define the location of parts of the shielding element relative to the substrate irrespective of the orientation of the substrate itself. Hence, the upper edge of the side wall is that edge that is in a remote position whereas the lower edge is that edge that is in contact with the substrate after mounting.

As described above, mounting of a conventional shielding element onto a printed circuit board needs two mounting steps: First, mounting the side wall to the printed circuit bar and second, fixing the cover to the side wall. Often it is necessary to access the component for replacement or repair. A wide variety of methods to do this have been proposed. For example, U.S. Pat. No. 6,903,262 discloses a one-piece shielding element with notches in the planar shield cover to form a predetermined breaking line. The use of opposed V-shaped grooves is suggested in U.S. Pat. No. 6,831,224 for breakably and releasably opening the shield yet maintain a bendable hinge. U.S. Pat. No. 6,384,324 provides a shielding screen wherein the upper face has a precut line and holes to allow removal of the upper face of the shield. U.S. Pat. No. 5,614,694 provides shear lines and a hinge to allow the metallic cover to be raised and closed.

Costs are a driving force in the electronics industry. Typical board level shield having a two piece construction includes a shielding element composed of a shield cover or lid mounted on a side wall soldered to a circuit board surrounding the component. The side walls include holes or dimples for receiving corresponding projections or holes for engaging the walls of the lid. Such a two piece construction requires almost twice as the raw materials and processing costs of a one-piece design.

Notwithstanding these improvements in a variety of board level shields, there remains a need to provide yet an easy to install and less expensive way to provide access to the shielded electronic components that need to be serviced.

SUMMARY OF THE INVENTION

Generally speaking, in accordance with the invention, a one-piece board level shielding element with a top cover peel-away panel defined by a peel line secured to a circuit board to shield a component and provide access to the shielded component is provided. The shielding element is formed with a top cover having a tear-off line to facilitate removal with a peel-away tool. The original shielding element side walls remain on the circuit board. Once the component is repaired, a new replacement lid is put on to the remaining side-walls to reestablish the shielding. The side walls are provided with holes or dimples for attaching a replacement lid with corresponding dimples or holes on the replacement side walls dimensioned to fit over the remaining side walls.

The top is formed with a peel tool insertion slot and an adjacent peel start slot on the peel line. In order to remove the peel panel, a peel hook mounted to a cylindrical peel key is inserted into the insertion slot and hooked the shield cover at the peel start slot. Upon rotating the peel key away from the peel start slot, the peel panel is easily removed along the peel line. A fixture plate with a central opening allows the peel key to remove the peel panel without damage to the side walls.

Accordingly, it is an object of the invention to provide a one-piece shielding element for electric and/or electronic components of an electric and/or electronic circuit that provide access to the component after repair and assembly.

Another object of the invention is to provide a one-piece shielding element with a top cover formed with an improved peel panel.

A further object of the invention is to provide a one-piece shielding element with peel panel that readily accepts a replacement lid after removal of the peel panel.

Yet another object of the invention is to provide a one-piece shielding element with a top peel panel having a peel tool insertion slot and peel start slot.

Still another object of the invention is to provide a peel tool for removing the peel panel of a shielding element.

Yet a further object of the invention is to provide a fixture plate for use with a peel tool for moving the peel panel.

The invention accordingly comprises a product possessing the features, properties, and the relation of components and the several steps and the relation of one or more of each steps with re-respect to each of the others which will be exemplified in the product hereinafter described, and the scope of the invention will be indicated in the claims.

BRIEF DESCRIPTION OF THE DRAWINGS

For a fuller understanding of the invention, reference is had to the following description taken in connection with the accompanying drawing(s), in which.

DETAILED DESCRIPTION OF THE INVENTION

Figure 1:
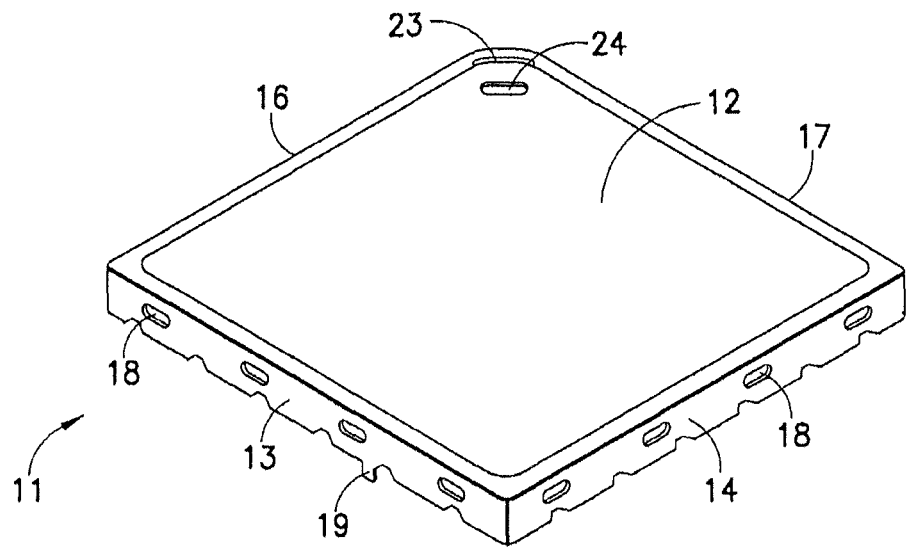
FIG. 1 is a perspective view of a shielding element having a top cover with a peel line constructed and arranged in accordance with the invention.
Figure 2:
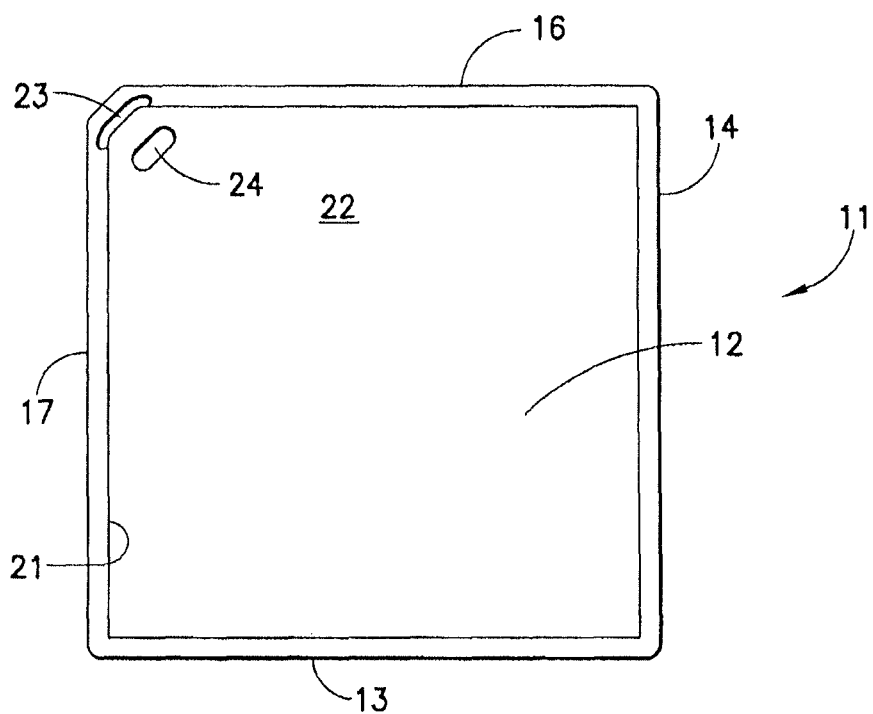
FIG. 2 is a top plan view of the shielding element of FIG. 1.

FIG. 1 is a perspective view of a one-piece shielding element 11 for shielding an electric or electronic component on a printed circuit board. Shielding element 11 has a top cover 12 that is essentially square in this embodiment, but can be any shape, such as rectangular, triangular, and the like. Shielding element 11 has four side walls 13, 14, 16 and 17 extending at about 90° from top cover for mounting on a circuit board about the electronic component to be shielded.

Figure 3:
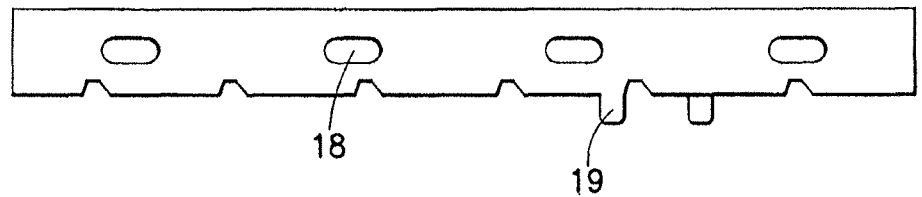
FIG. 3 is a side elevational view of one side of the shielding element of FIGS. 1 and 2.

Side walls 13, 14, 16 and 17 are each formed with a plurality of openings 18. Side walls 13, 16, and 17 are each formed with a mounting tab 19 shown in side wall 13 in FIG. 3 for positioning shielding element 11 on a circuit board and soldering it thereto.

Top cover 12 is a treated to form a peel line 21 that defines a peel panel 22. In order to facilitate removal of peel panel 22 to access the shielded component for repair, top cover 12 is also formed with a peel start slot 23 in one corner of cover 12 along peel line 21. A peel tool insertion slot 24 is formed adjacent to peel start slot 23 in peel panel 22.

Peel line 21 is formed by work hardening top cover 12 in a selected predetermined line around the perimeter of shielding element top cover 12 to form tear away zone, or peel panel 22. Various ways are available to treat the material of top cover 12, such as by forming a pinch edge, compressing the material, or forming a groove on the underside of cover 12. It has been found that forming a groove having a flat at the bottom of the groove and angled side wall as shown in FIG. 4 provides consistent results and causes less wear on the groove punch.

Figure 4:
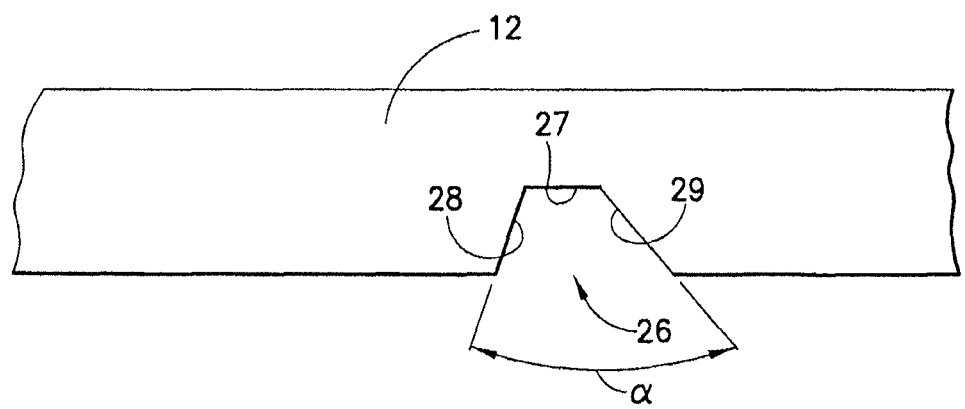
FIG. 4 is an exploded sectional view of the top cover of the shielding element of FIG. 1 showing a groove of a preformed peel line.

As shown in FIG. 4, a groove 26 is punched into the lower surface of cover 12. Groove 26 has a trapezoidal cross-section and extends into a portion of the thickness of cover 12 between about 50-85 percent of the thickness of top cover 12. Groove 26 ends in a flat wall 27 and two angled walls 28 and 29 at an angle α. It is desirable to maintain angle α at a minimum to reduce the volume of material displaced by the die. Preferable, angle α is maintained at less than about 30° and most preferable between about 10 and 20°.

Figure 5:
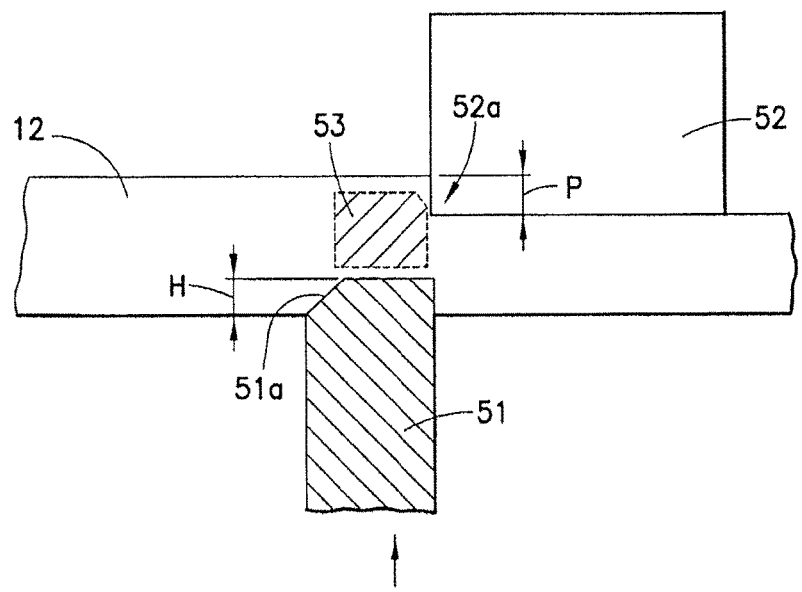
FIG. 5 is an exploded sectional view of the top cover of the shielding element of FIG. 1 showing a preformed peel line formed by a half shear method with a coining ring.

Referring to FIG. 5, preformed peel line 21 may be formed with a coining ring 51 engaging the bottom surface of top cover 12 and a punch 52 engaging the upper surface of top cover 12 causing cover material 12 to compress. This forms a pinch edge 52a and a work hardened area 53 and causes top cover 12 to shear upwardly slightly at pinch edge 52a a distance P. Coining ring 51 may be square or have an inclined edge 51a and enter into cover 12 a depth H of between about 30 to 70 percent of the thickness of top cover 12. Preferably, depth H is between about 40 to 60 percent of the thickness of top cover 12. This work hardened section forms a groove 12a in the bottom surface of top cover 12. Groove 12a and work hardened area 53 form peel line 21. Distance P of pinch edge 52a formed on the upper surface of top cover 12 is between about 30 to 70 percent of depth H, and preferably between about 40 to 60 percent of depth H.

Figure 6:
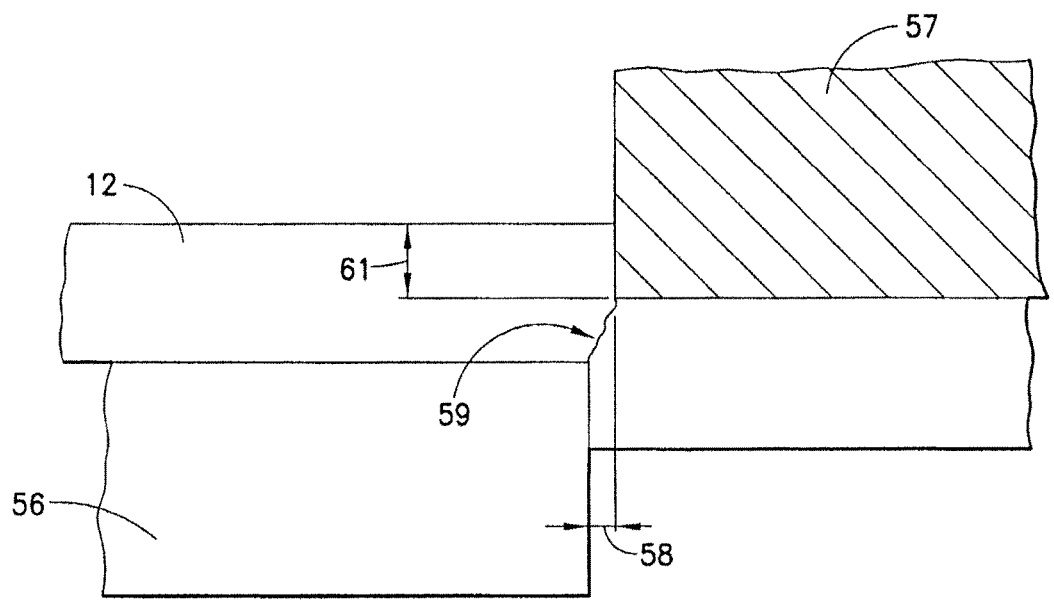
FIG. 6 is an exploded sectional view of the top cover of the shielding element of FIG. 1 showing a preformed peel line formed by a half shear method using a punch and die.

FIG. 6 shows another half shear method to form peel line 21. A square edged die 56 engages the bottom surface of top cover 12 and a punch 57 engages the top surface of cover 12 a distance 58 from punch 57. This forms a cut clearance of between about 5 to 20 percent of the thickness of top cover 12, preferably between about 5-10 percent of the material thickness. This causes a shear thickness 61 of top cover 12 of between about 10 to 30 percent, and preferably between about 15 to 20 percent of the thickness of top corner. A work hardened section 59 between die 56 and punch 57 allows cover 12 to break along work hardened section 59 corresponding to peel line 21.

Figure 7:
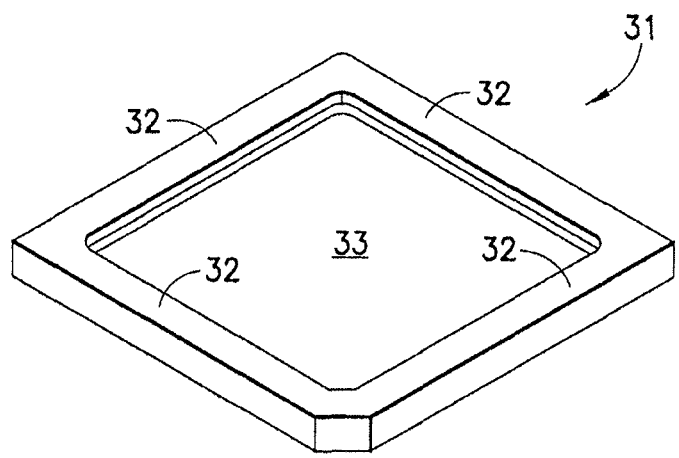
FIG. 7 is a perspective view of a fixture plate suitable for use in removing a peel panel from a top cover of a shielding element constructed in accordance with the invention.
Figure 8:
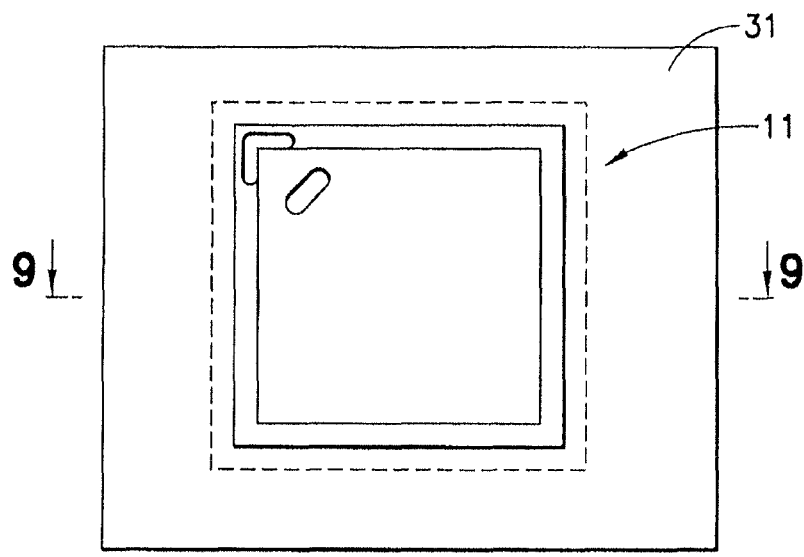
FIG. 8 is a top plan view of the fixture plate of FIG. 6 in position on a shielding element.
Figure 9:
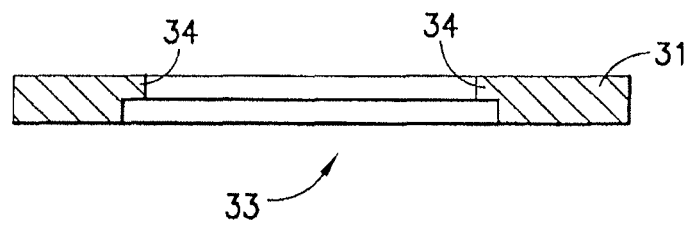
FIG. 9 is a sectional view of the fixture plate taken along line 7-7 in FIG. 6.

FIG. 7 is a perspective view of a fixture plate 31 used with one-piece shielding element 11 to facilitate removal of peel panel 22. Fixture plate 31 is complementary in size and shape to fit over shielding element 11 and has four legs 32 and an open center 33 to provide access to peel panel 22. Open center 33 is between peel line 21 and the edges of top cover 12 at side walls 13, 14, 16 and 17. As shown in the cross-section in FIG. 9, fixture panel 31 has a flange 34 that fits over and covers a portion of cover 12 outside of peel line 21. This is shown in the plan view of FIG. 8 with fixture plate 31 positioned on shielding element 11.

Figure 10:
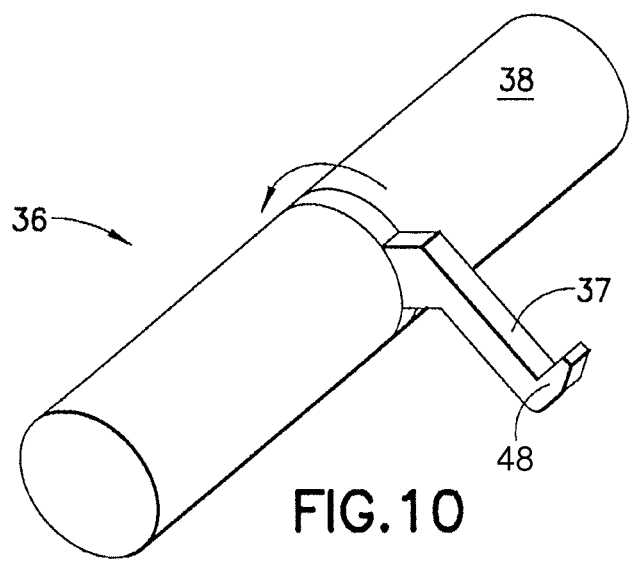
FIG. 10 is a perspective view of a peel tool constructed and arranged in accordance with the invention.
Figure 12:
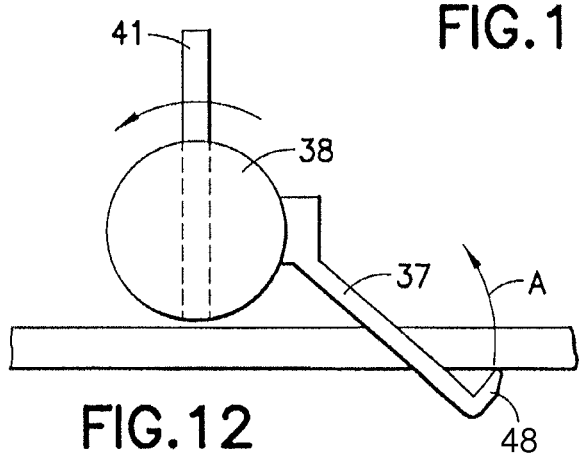
FIG. 12 is a sectional view of the peel tool of FIG. 9 inserted into the top cover for removal of the peel panel.

In order to remove peel panel 22, a peel tool 36 as shown in FIGS. 10 and 12 is used. Peel tool 36 has an elongated key section 37 with a peel hook 48 at the distal end and is connected at the proximal end to a cylindrical peel key 38. Peel key 38 is provided with holes 39 for inserting a peel pin 41 for added leverage in removing peel panel 22.

Figure 11:
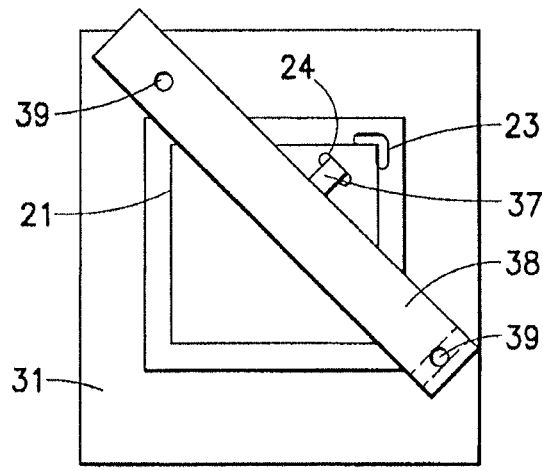
FIG. 11 is a top plan of a peel tool positioned on a fixture plate of FIG. 6; in accordance with the invention.

In order to use peel tool 36 to remove peel panel 22 and provide access to the electrical component the following steps are followed. Peel fixture plate 31 is positioned on shielding element 11. When properly positioned, fixture plate 31 cradles shielding element 11 and restrains the edge of cover 12 yet allows access to peel panel 22. As shown in FIGS. 11 and 12, peel hook tip is inserted into insertion slot 24 and peel hook tip is positioned into peel start slot 23 with peel key 38 positioned on two walls 32 of fixture plate 31. Pin 41 is inserted into hole 39 of peel key 38 and rotated away from peel start slot 23 in a direction shown by arrow A. Peel key 38 pushes downward on fixture plate 31 when peel key 38 is rotated in the direction of an arrow A and peeling force is applied to peel panel 22. Peel panel 22 then easily separates from cover 12 along preformed peel line 21.

Figure 13:
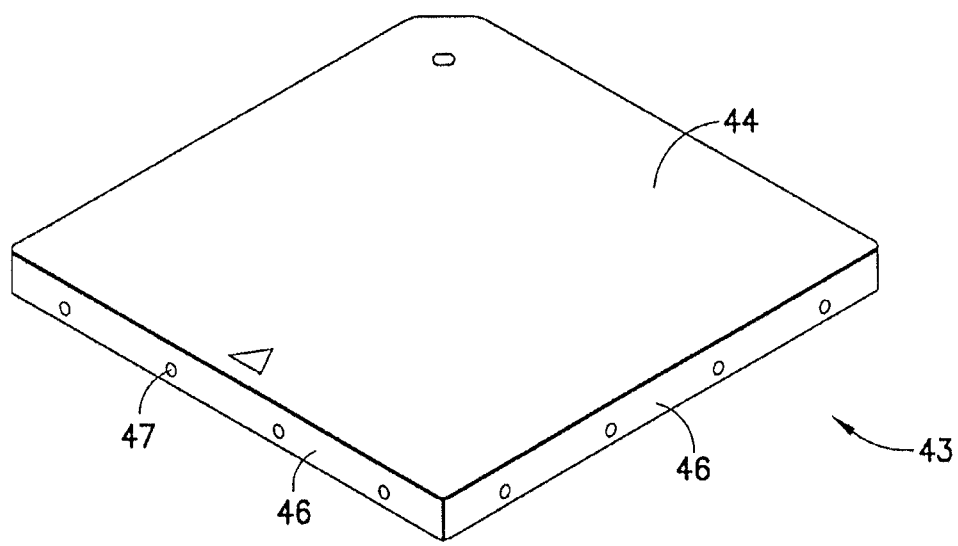
FIG. 13 is a perspective view of a replacement lid for use with the shielding element of FIG. 1.
Figure 14:
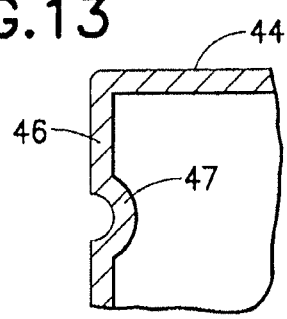
FIG. 14 is a partial sectional view of a portion of the replacement lid of FIG. 13.
Figure 15:
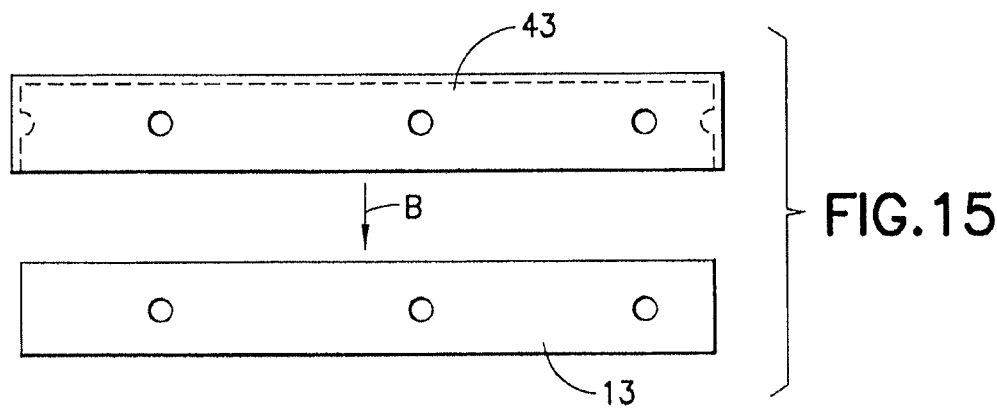
FIG. 15 is a showing of a replacement lid being positioned over side walls of the shielding element of FIG. 1 in accordance with the invention.

Removal of peel panel 22 provides complete access to the component being shielded by shielding element 11. Once the repairs have been completed, a replacement lid 43 as shown in FIG. 13 can be easily installed. Replacement lid 43 includes a top cover 44 and four side walls 46 at about 90° to cover 44. Each side wall 46 is provided with projecting nipples 47 on the inner surface to fit into holes 18 in the remaining base walls 13, 14, 16 and 17 of shielding element 11 when replacement lid 43 is positioned in a direction shown by an arrow B as shown in FIG. 15. This completes the repair process and provides shielding to the repaired component.

While the invention has been described with reference to certain preferred embodiments, numerous changes, alterations and modifications to the described embodiments are possible without departing from the spirit and scope of the invention as defined in the appended claims, and equivalents thereof.

It will thus be seen that the objects set forth above, among those made apparent from the preceding description, are efficiently attained and, since certain changes may be made in the above method product without departing from the spirit and scope of the invention, it is intended that all matter contained in the above description and shown in the accompanying drawing(s) shall be interpreted as illustrative and not in a limiting sense.

The present invention may be embodied in other specific forms without departing from the spirit or essential attributes of the invention.

What is claimed is:

1. A peel key for removing a peel panel of a shielding element on an electric circuit, the peel key comprising:
    an elongated cylindrical key having an exterior cylindrical face and a central axis, the elongated cylindrical key configured to roll about the central axis along the peel panel of the shielding element; and
    an elongated member having a proximal end fixed to a central portion of the central axis of the elongated cylindrical key, a distal end positioned away from the central axis, and a planar key engagement face extending between the proximal end and the distal end of the elongated member,
    the elongated member extending radially at an angle from the central portion of the central axis of the elongated cylindrical key and having a peel hook at the distal end,
    the peel hook extending perpendicular to the elongated member, the peel hook having a planar hook engagement face at an angle to the planar key engagement face of the elongated member, and a tip,
    wherein the tip of the peel hook extends through and engages a peel start slot in the peel panel of the shielding element, the tip of the peel hook rotating about the central axis to remove the peel panel of the shielding element when the elongated cylindrical key is rolled about the central axis along the peel panel of the shielding element.

2. The peel key of claim 1, including at least one pin hole for receiving a pin to assist rotation of the peel key.

3. The peel key of claim 1, wherein the elongated cylindrical key is dimensioned to rest on a fixture plate which supports the peel key during removal of the peel panel of the shielding element.

4. The peel key of claim 3, wherein the peel key is adapted to rotate along the fixture plate to remove the peel panel.

5. A peel key for removing a peel panel of a shielding element on an electric circuit, the peel key comprising: a cylindrical peel key having an exterior cylindrical face and a central axis; an elongated key section fixed to the cylindrical peel key at a proximal end of the elongated key section and extending radially at an angle from a central portion of the central axis of the cylindrical peel key, the elongated key section having a planar key engagement face extending between the proximal end of the elongated key section and a distal end of the elongated key section positioned away from the central axis of the cylindrical peel key; and a peel hook at the distal end of the elongated key section and extending perpendicular to the elongated key section, the peel hook having a planar hook engagement face at an angle to the planar key engagement face and a tip, wherein the tip of the peel hook extends through and engages a peel start slot in the peel panel of the shielding element, the tip of the peel hook rotating about the central axis to remove the peel panel of the shielding element when the cylindrical key is rolled about the central axis along the peel panel of the shielding element.

6. The peel key of claim 5, wherein the cylindrical peel key includes at least one pin hole for receiving a pin.

7. The peel key of claim 6, wherein the cylindrical peel key includes a plurality of pin holes.

8. The peel key of claim 7, wherein the cylindrical peel key includes a pin hole at each end of the cylindrical peel key.

9. The peel key of claim 5, wherein the cylindrical peel key is dimensioned to rest on walls of a fixture plate which supports the peel key in removal of the peel panel.

10. The peel key of claim 9, wherein the peel key is adapted to rotate along the fixture plate to remove the peel panel.

11. The peel key of claim 5, wherein the peel hook is configured for insertion into a slot of the peel panel of the shielding element.

12. The peel key of claim 2 further comprising a pin removably insertable into the pin hole in the peel key.

13. The peel key of claim 6 further comprising a pin removably insertable into the pin hole in the cylindrical peel key.

14. A peel key, comprising: an elongated cylindrical key having an exterior cylindrical face and a central axis; and an elongated member having a proximal end fixed to and extending radially at an obtuse angle from a central portion of the central axis of the cylindrical key, a planar key engagement face and a distal end positioned away from the central axis, wherein the elongated member has a peel hook at the distal end, and the peel hook extends perpendicular to the elongated member, the peel hook having a planar hook engagement face at an angle to the planar key engagement face of the elongated member, and a tip, wherein the tip of the peel hook extends through and engages a peel start slot in the peel panel of the shielding element, the tip of the peel hook rotating about the central axis to remove the peel panel of the shielding element when the cylindrical key is rolled about the central axis along the peel panel of the shielding element.

15. The peel key of claim 14, including at least one pin hole for receiving a pin to assist rotation of the peel key.

16. The peel key of claim 14, wherein the elongated cylindrical key is dimensioned to rest on a fixture plate which supports the peel key during removal of the peel panel of the shielding element.

17. The peel key of claim 16, wherein the peel key is adapted to rotate along the fixture plate to remove the peel panel of the shielding element.

18. The peel key of claim 15, further comprising a pin removably insertable into the pin hole in the peel key.

\* \* \* \* \*